United States Patent
Filgas et al.

(10) Patent No.: US 10,411,435 B2
(45) Date of Patent: Sep. 10, 2019

(54) DUAL-AXIS ADAPTIVE OPTIC (AO) SYSTEM FOR HIGH-POWER LASERS

(71) Applicant: Raytheon Company, Waltham, MA (US)

(72) Inventors: David M. Filgas, Newbury Park, CA (US); Andrew D. W. McKie, Northborough, MA (US)

(73) Assignee: Raytheon Company, Waltham, MA (US)

( * ) Notice: Subject to any disclaimer, the term of this patent is extended or adjusted under 35 U.S.C. 154(b) by 604 days.

(21) Appl. No.: 15/174,369

(22) Filed: Jun. 6, 2016

(65) Prior Publication Data

US 2018/0254609 A1  Sep. 6, 2018

(51) Int. Cl.
*G02F 1/01* (2006.01)
*G02F 1/29* (2006.01)
(Continued)

(52) U.S. Cl.
CPC .......... *H01S 5/06832* (2013.01); *G02F 1/011* (2013.01); *G02F 1/0147* (2013.01);
(Continued)

(58) Field of Classification Search
CPC ........ H01S 5/068; H01S 3/063; H01S 3/0632; H01S 3/1301; H01S 3/1305
See application file for complete search history.

(56) References Cited

U.S. PATENT DOCUMENTS

| 5,105,430 A | 4/1992 | Mundinger et al. |
| 5,363,391 A | 11/1994 | Matthews et al. |

(Continued)

FOREIGN PATENT DOCUMENTS

| EP | 0981191 A2 | 2/2000 |
| WO | 0161799 A2 | 8/2001 |
| WO | 2008133648 A2 | 11/2008 |

OTHER PUBLICATIONS

Foreign Communication from Related Counterpart Application; PCT Patent Application No. PCT/US2017/019520; International Search Report and Written Opinion of International Searching Authority dated Nov. 7, 2017; 12 pages.

(Continued)

*Primary Examiner* — Eric L Bolda

(57) ABSTRACT

A system includes a master oscillator configured to generate a low-power optical beam. The system also includes a planar waveguide (PWG) amplifier configured to generate a high-power optical beam using the low-power optical beam. The PWG amplifier has a larger dimension in a slow-axis direction and a smaller dimension in a fast-axis direction. The system further includes at least one adaptive optic (AO) element configured to modify the low-power optical beam along the slow-axis direction and to modify the low-power optical beam along the fast-axis direction. In addition, the system includes a feedback loop configured to control the at least one AO element. The modification in the slow-axis direction can compensate for thermal-based distortions created by the PWG amplifier, and the modification in the fast-axis direction can compensate for optical misalignment associated with the master oscillator and the PWG amplifier.

23 Claims, 4 Drawing Sheets

(51) Int. Cl.
*H01S 3/00* (2006.01)
*H01S 3/08* (2006.01)
*H01S 3/13* (2006.01)
*H01S 3/23* (2006.01)
*H01S 3/063* (2006.01)
*H01S 5/062* (2006.01)
*H01S 5/0683* (2006.01)
*H04N 5/335* (2011.01)
*H01S 5/04* (2006.01)

(52) U.S. Cl.
CPC .............. *G02F 1/29* (2013.01); *H01S 3/0632* (2013.01); *H01S 3/1305* (2013.01); *H01S 3/2308* (2013.01); *H01S 5/041* (2013.01); *H01S 5/062* (2013.01); *H04N 5/335* (2013.01); *H01S 3/0071* (2013.01); *H01S 3/08072* (2013.01)

(56) References Cited

U.S. PATENT DOCUMENTS

| | | | |
|---|---|---|---|
| 5,398,130 | A | 3/1995 | Redman |
| 6,160,824 | A | 12/2000 | Meissner et al. |
| 6,404,784 | B2* | 6/2002 | Komine .............. F41H 13/0062 359/241 |
| 6,690,696 | B2 | 2/2004 | Byren et al. |
| 6,738,396 | B2 | 5/2004 | Filgas et al. |
| 6,809,307 | B2 | 10/2004 | Byren et al. |
| 6,810,060 | B2* | 10/2004 | Vetrovec ................. H01S 3/042 372/35 |
| 6,859,472 | B2 | 2/2005 | Betin et al. |
| 6,937,629 | B2 | 8/2005 | Perry et al. |
| 7,065,121 | B2 | 6/2006 | Filgas et al. |
| 7,472,741 | B2 | 1/2009 | Johnson et al. |
| 7,983,312 | B2 | 7/2011 | Shkunov et al. |
| 8,565,272 | B2 | 10/2013 | Shkunov et al. |
| 8,731,013 | B2 | 5/2014 | Byren et al. |
| 8,787,768 | B2 | 7/2014 | Klotz et al. |
| 8,977,097 | B2 | 3/2015 | Filgas |
| 9,014,226 | B2 | 4/2015 | Perin |
| 2002/0110166 | A1 | 8/2002 | Filgas |
| 2004/0028094 | A1 | 2/2004 | Betin et al. |
| 2006/0108098 | A1 | 5/2006 | Stevanovic et al. |
| 2006/0109878 | A1* | 5/2006 | Rothenberg .......... H01S 3/0606 372/35 |
| 2008/0069160 | A1 | 3/2008 | Stephens, IV |
| 2008/0095204 | A1 | 4/2008 | Miyajima et al. |
| 2010/0078577 | A1* | 4/2010 | Moriya .................. H05G 2/003 250/504 R |
| 2012/0103569 | A1 | 5/2012 | Kim |
| 2013/0294468 | A1 | 11/2013 | Sridharan et al. |
| 2014/0268309 | A1 | 9/2014 | Strohkendl |
| 2015/0071321 | A1 | 3/2015 | Moshchansky-Livingston et al. |
| 2015/0250045 | A1* | 9/2015 | Tao ........................ H01S 3/1003 250/504 R |
| 2015/0378093 | A1 | 12/2015 | Murgal |
| 2016/0047981 | A1 | 2/2016 | Filgas et al. |
| 2016/0047982 | A1 | 2/2016 | Filgas |
| 2018/0212393 | A1* | 7/2018 | Filgas ................. H01S 3/10015 |

OTHER PUBLICATIONS

The International Searching Authority, "Notification of Transmittal of the International Search Report and the Written Opinion of The International Searching Authority, or the Declaration," International Application No. PCT/US2016/054252, dated Nov. 24, 2016, 12 pages, publisher EPO, Rijswijk, Netherlands.

International Search Report and Written Opinion of International Searching Authority dated Feb. 5, 2016 in connection with International Application No. PCT/US2015/055014, 8 pgs.

Pearson et al., Applied Optics and Optical Engineering, edited by R. Shannon and J. Wyant, vol. VII, Chapter 8, "Adaptive Techniques for Wave-Front Correction", 1979, pp. 259-264.

P. McManamon et al., "Review of Phased Array Steering for Narrow-Band Electrooptical Systems", Proceedings of the IEEE, vol. 97, No. 6, Jun. 2009, pp. 1078-1096.

Filgas et al., "System and Method for Cooling a Laser Gain Medium Using an Ultra-Thin Liquid Thermal Optical Interface", U.S. Appl. No. 14/661,828, filed Mar. 18, 2015, 25 pgs.

Zamudio et al., "Techniques for Forming Waveguides for Use in Laser Systems or Other Systems and Associated Devices", U.S. Appl. No. 14/845,916, filed Sep. 4, 2015, 26 pgs.

Filgas et al., "High-Power Planar Waveguide (PWG) Pumphead With Modular Components for High-Power Laser System", U.S. Appl. No. 15/233,238, filed Aug. 10, 2016, 77 pgs.

Filgas et al., "High-Gain Single Planar Waveguide (PWG) Amplifier Laser System", U.S. Appl. No. 15/233,913, filed Aug. 10, 2016, 77 pgs.

Filgas et al., "Dual-Function Optical Bench and Cooling Manifold for High-Power Laser System ", U.S. Appl. No. 15/233,928, filed Aug. 10, 2016, 80 pgs.

McGanty et al., "Planar Waveguides With Enhanced Support and/or Cooling Features For High-Power Laser Systems", U.S. Appl. No. 15/041,909, filed Feb. 11, 2016, 38 pgs.

Filgas et al., "Integrated Pumplight Homogenizer and Signal Injector for High-Power Laser System", U.S. Appl. No. 15/233,303, filed Aug. 10, 2016, 81 pgs.

Filgas et al., Planar Waveguide (PWG) Amplifier-Based Laser System With Adaptive Optic Wavefront Correction in Low-Power Beam Path, U.S. Appl. No. 15/246,076, 39 pages.

* cited by examiner

DUAL-AXIS ADAPTIVE OPTIC (AO) SYSTEM FOR HIGH-POWER LASERS

TECHNICAL FIELD

This disclosure is generally directed to high-power laser systems. More specifically, this disclosure is directed to a dual-axis adaptive optic (AO) system for high-power lasers.

BACKGROUND

High-power laser systems are being developed for a number of military and commercial applications. In some laser systems, a master oscillator/power amplifier (MOPA) configuration uses a master oscillator to generate a low-power optical signal that is then amplified by a power amplifier to generate a high-power output beam. Unfortunately, high-power laser systems having a MOPA configuration can experience degradation in the overall quality of an output beam due to various factors. These factors can include thermally-induced distortions created within a gain medium of the power amplifier, as well as misalignment of the master oscillator's beam with respect to the power amplifier.

SUMMARY

This disclosure provides a dual-axis adaptive optic (AO) system for high-power lasers.

In a first embodiment, a system includes a master oscillator configured to generate a low-power optical beam. The system also includes a planar waveguide (PWG) amplifier configured to generate a high-power optical beam using the low-power optical beam. The PWG amplifier has a larger dimension in a slow-axis direction and a smaller dimension in a fast-axis direction. The system further includes at least one AO element configured to modify the low-power optical beam along the slow-axis direction and to modify the low-power optical beam along the fast-axis direction. In addition, the system includes a feedback loop configured to control the at least one AO element.

In a second embodiment, a method includes generating a low-power optical beam using a master oscillator. The method also includes amplifying the low-power optical beam to generate a high-power optical beam using a PWG amplifier. The PWG amplifier has a larger dimension in a slow-axis direction and a smaller dimension in a fast-axis direction. The method further includes, using at least one AO element, modifying the low-power optical beam along the slow-axis direction and along the fast-axis direction. In addition, the method includes controlling the at least one AO element using a feedback loop.

In a third embodiment, an apparatus includes at least one interface configured to receive measurements of samples of a high-power optical beam generated by a PWG amplifier using a low-power optical beam generated by a master oscillator. The PWG amplifier has a larger dimension in a slow-axis direction and a smaller dimension in a fast-axis direction. The apparatus also includes at least one processing device configured to control at least one AO element to modify the low-power optical beam along the slow-axis direction and along the fast-axis direction.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 5, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
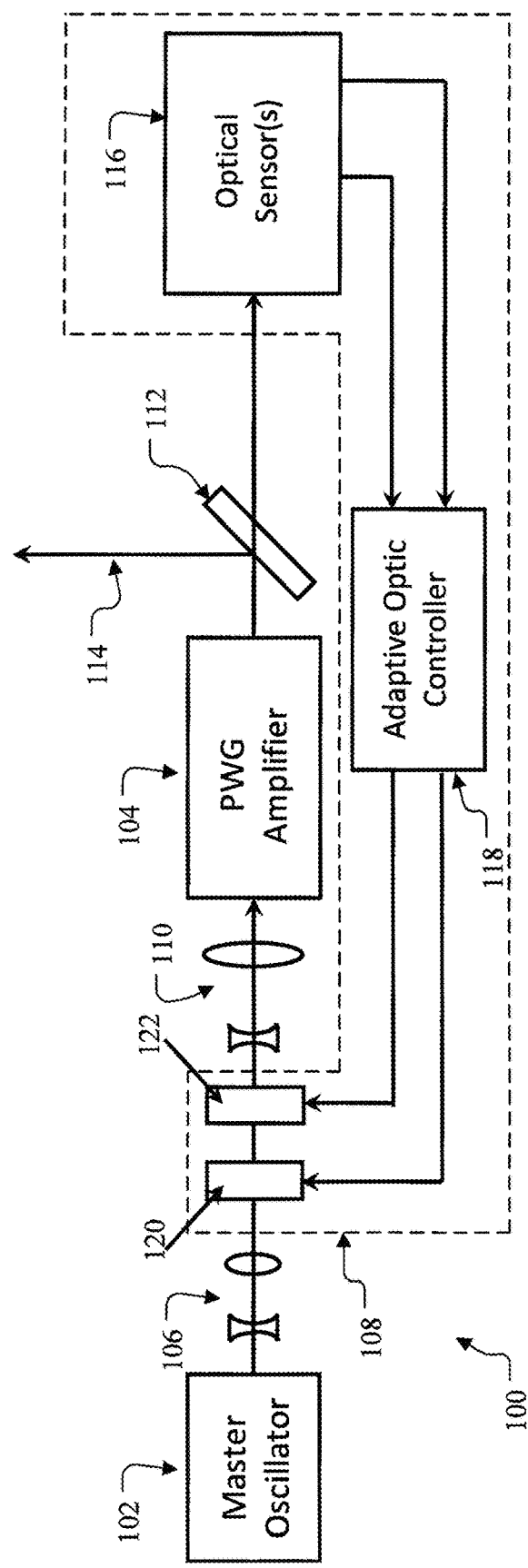
FIG. 1 illustrates an example high-power laser system supporting a dual-axis adaptive optic (AO) system according to this disclosure.

FIG. 1 illustrates an example high-power laser system 100 supporting a dual-axis adaptive optic (AO) system according to this disclosure. As shown in FIG. 1, the laser system 100 includes a master oscillator 102 and a planar waveguide (PWG) amplifier 104. The laser system 100 therefore has a master oscillator/power amplifier (MOPA) configuration.

The master oscillator 102 generally operates to generate low-power optical signals. The low-power optical signals could denote any suitable optical signals having relatively low power. For example, the low-power optical signals could include optical signals having a continuous wave (CW) output, a continuous pulse train (CPT), a pulse burst, or any of various other waveforms. The master oscillator 102 includes any suitable structure(s) for generating one or more low-power optical signals. In some embodiments, the master oscillator 102 includes a fiber laser.

The PWG amplifier 104 receives the low-power optical signals from the master oscillator 102 and pump power. The PWG amplifier 104 generally operates to amplify the low-power optical signals and generate high-power optical signals. For example, the PWG amplifier 104 could amplify a low-power CW or other optical signal into a high-power CW or other optical signal having ten kilowatts of power or more. The received pump power provides the necessary population inversion in the PWG amplifier's gain medium for this amplification.

Figure 2:
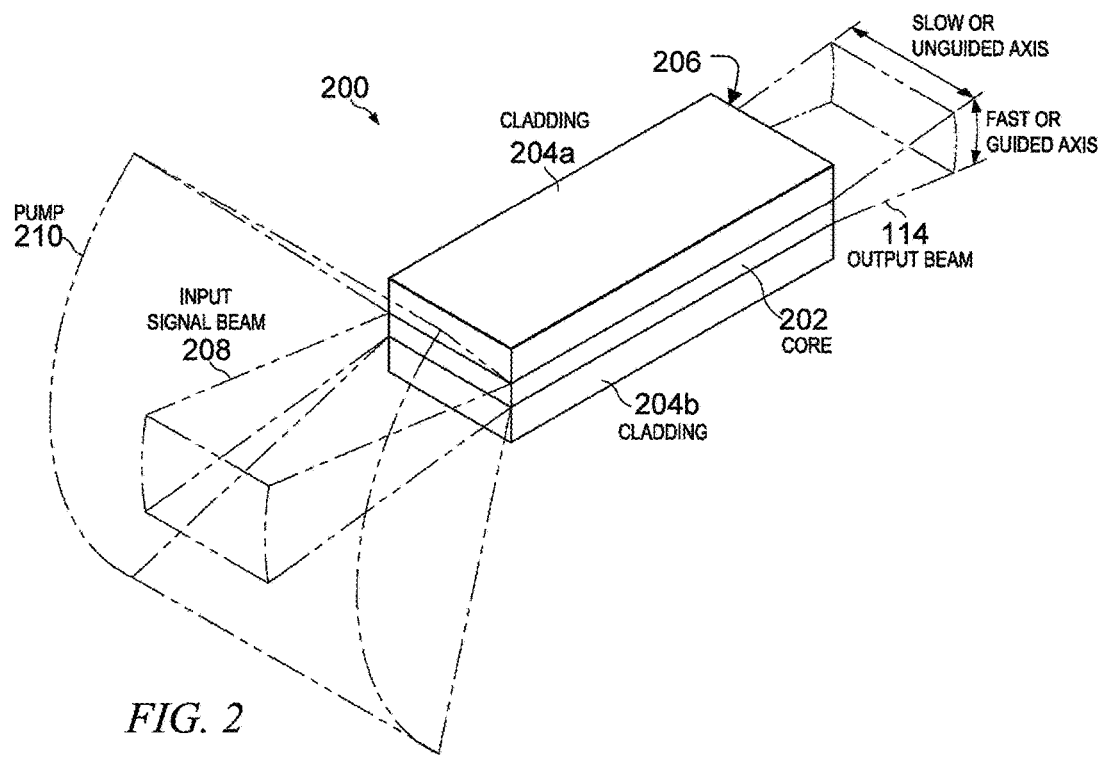
FIG. 2 illustrates an example planar waveguide for use in a high-power laser system according to this disclosure.

The gain medium of the PWG amplifier 104 is formed using a planar waveguide, an example of which is shown in FIG. 2. As shown in FIG. 2, a planar waveguide 200 generally denotes a structure that includes a core region 202 and one or more cladding layers 204a-204b. The core region 202 is doped with an active ion species responsive to optical signals of at least one specific wavelength, and the one or more cladding layers 204a-204b are optically transparent and contact the core region 202. A number of additional features, such as an anti-reflective coating 206 on input or output face(s) of the cladding layers 204a-204b, could be used. A signal beam 208 from the master oscillator 102 is coupled into the core region 202 of the planar waveguide 200, and pumplight 210 is coupled into the core region 202 and/or one or more of the cladding layers 204a-204b to provide pump power for optical amplification. The indexes of refraction and dielectric constants of the core region 202 and the cladding layer(s) 204a-204b differ and create boundaries that reflect the optical signals of the signal beam 208. The planar waveguide 200 therefore operates to guide the optical signals of the signal beam 208 in its narrower dimension (referred to as the "fast axis" or "guided axis" direction) but not in its broader dimension (referred to as the "slow axis" or "unguided axis" direction). The planar waveguide 200 could be formed from any suitable materials and in any suitable manner.

Returning to FIG. 1, relay optics 106 direct the optical signals from the master oscillator 102 into a dual-axis AO system 108, and relay optics 110 direct the optical signals from the AO system 108 into the PWG amplifier 104. The relay optics 106 and 110 can also alter the cross-sectional dimensions of the optical signals as needed for injection into the AO system 108 and the PWG amplifier 104, respectively. Each of the relay optics 106 and 110 includes any suitable optical device(s) for directing or formatting optical signals.

The AO system 108 generally operates to modify the optical signals from the master oscillator 102 before the optical signals reach the PWG amplifier 104. For example, the AO system 108 could pre-distort the phase profile of the optical signals from the master oscillator 102 in order to substantially or completely compensate for thermally-induced optical phase distortions created within the PWG amplifier 104. The AO system 108 could also pre-distort both the amplitude and phase of the optical signals from the master oscillator 102. The AO system 108 could further include separate control devices for two-axis tip/tilt alignment control and higher-order beam control. In addition, the AO system 108 could correct for misalignment of optical components in the master oscillator/power amplifier beamline. Additional details regarding the AO system 108 are provided below.

A high-power output beam generated by the PWG amplifier 104 is directed towards a beam splitter 112. The beam splitter 112 provides a substantial portion of the high-power output beam as a system high-power output beam 114. The beam splitter 112 also provides a small amount of the high-power output beam as samples to a feedback loop of the AO system 108. Among other things, the feedback loop is used to control and modify the operation of AO elements within the AO system 108. The beam splitter 112 includes any suitable structure(s) for splitting optical signals.

The feedback loop here includes one or more optical sensors 116 and an AO controller 118. The optical sensors 116 generate measurements of the samples of the high-power output beam 114 and output the measurements to the AO controller 118. The AO controller 118 uses the measurements to determine how to modify operation of the AO elements within the AO system 108 in order to increase or maximize the quality of the output beam 114. Note that while shown here as residing before the PWG amplifier 104, other or additional AO functions could be located after the PWG amplifier 104 and controlled by the AO controller 118.

As described in more detail below, the AO system 108 operates to modify the master oscillator's signal beam along multiple axes, namely the slow-axis and fast-axis directions of the planar waveguide 200 shown in FIG. 2. The optical sensors 116 provide measurements used by the AO controller 118 to control the AO system 108. Effectively, this forms multiple control loops, at least one for the fast-axis direction and at least one for the slow-axis direction. Moreover, different sensor measurements are used in the different control loops, allowing the fast-axis and slow-axis control loops to be based on different metrics of the high-power output beam 114.

Figure 3A:
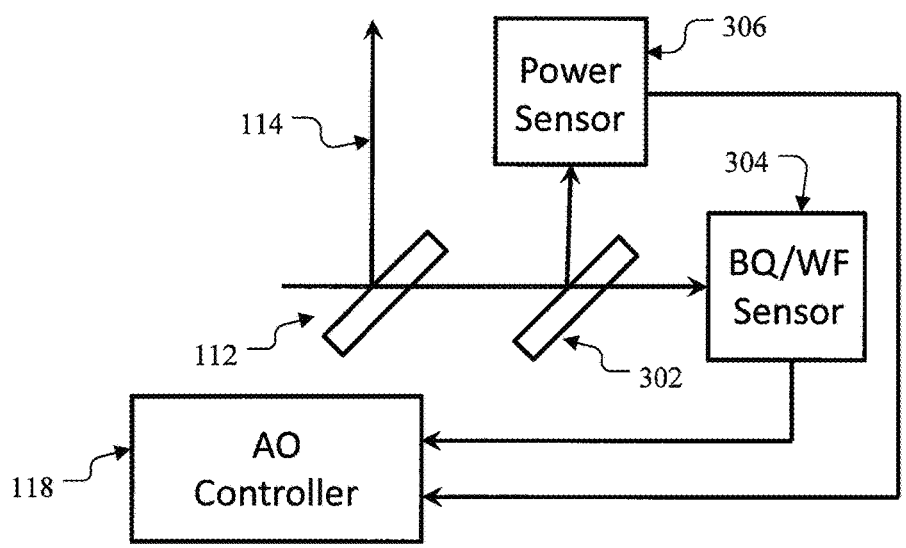
FIGS. 3A and 3B illustrate example sensor arrangements for use in a dual-axis AO system according to this disclosure.
Figure 3B:
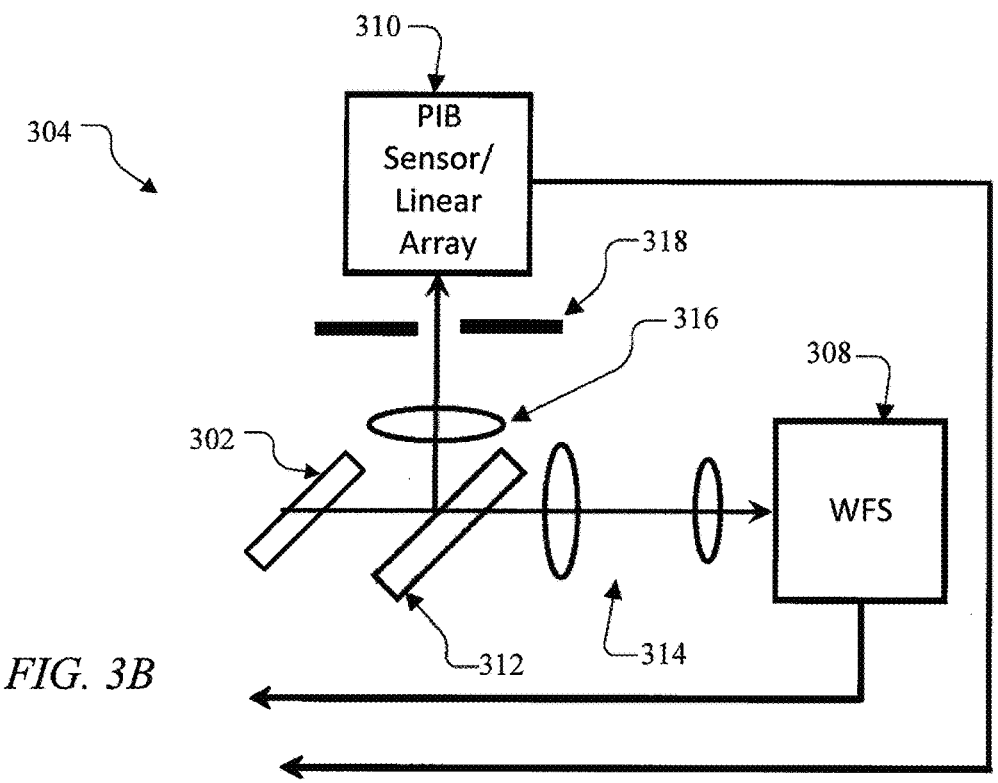

The optical sensors 116 include any suitable structure(s) for measuring one or more characteristics of samples of an optical signal. In some embodiments, one or more optical sensors 116 are used to capture measurements of the samples of the output beam 114 in the slow-axis direction and in the fast-axis direction of the planar waveguide 200. This could be accomplished using a single multi-dimensional optical sensor or using multiple one-dimensional (1D) or multi-dimensional optical sensors. As a particular example, a two-dimensional camera could be used to capture measurements of the samples, where one dimension of the camera corresponds to the slow-axis direction and the orthogonal dimension of the camera corresponds to the fast-axis direction. Other example implementations of the optical sensors 116 are shown in FIGS. 3A and 3B, which are described below.

The AO controller 118 includes any suitable structure for controlling operation of adaptive optical elements. For example, the AO controller 118 could include one or more processing devices, such as one or more microprocessors, microcontrollers, digital signal processors, field programmable gate arrays, application specific integrated circuits, or discrete logic devices. The AO controller 118 could also include one or more memories configured to store instructions or data used, generated, or collected by the processing device(s). The AO controller 118 could further include one or more interfaces configured to facilitate communications with other components or systems.

As described above, high-power laser systems having a MOPA configuration can experience degradation in the overall quality of an output beam due to various factors. These factors can include thermally-induced phase distortions created within the planar waveguide of a PWG amplifier. In conventional PWG amplifiers, the thickness of the core region in a planar waveguide is sufficiently small and the index of refraction difference between the core region and the cladding layer(s) is sufficiently small so that only low-order waveguide modes are allowed to propagate with low loss. This helps to maintain high beam quality for the master oscillator's signal beam in the fast-axis direction of the PWG amplifier, regardless of thermal distortions in the PWG amplifier. By matching the master oscillator's signal mode to the lowest order waveguide mode, single mode operation of the PWG amplifier can be obtained.

Because of the design of conventional PWG amplifiers, however, there is no guiding or mode control in the transverse slow-axis direction of the PWG amplifier. As a result, thermal distortions resulting from temperature differences across the slow axis of the PWG amplifier can create significant phase distortions in the master oscillator's signal beam across the slow axis as the signal beam traverses the length of the PWG amplifier. Such temperature differences may arise due to various reasons, such as (i) non-uniform pumping of the PWG amplifier, (ii) non-uniform stimulated emission extraction of energy deposited in the PWG amplifier by the pumping process, (iii) non-uniform extraction of energy via deleterious mechanisms such as amplified spontaneous emission (ASE) and parasitic lasing, (iv) non-uniform thermal contact resistance to cooling elements, and (v) thermal efficiency non-uniformities in cooling elements. This can be especially problematic for planar waveguides that have a high change in refractive index with temperature, meaning a high dn/dt. Depending on the severity of the thermal effects, the output beam from a PWG amplifier can be substantially degraded due to thermally-induced aberrations.

A MOPA configuration can also experience degradation in the overall quality of an output beam due to misalignment of the master oscillator's signal beam as the signal beam enters a power amplifier. For example, power loss in a planar waveguide of a power amplifier may occur due to vignetting of the master oscillator's signal beam as the signal beam enters the core region 202 of the planar waveguide 200. This vignetting can be caused by translational misalignment and is particularly severe in the fast axis of the planar waveguide 200. Power loss may also occur due to leakage of light rays that are only partially reflected by the waveguide surfaces. This could be due to angular misalignment in the fast axis of the planar waveguide 200. Power losses may further be due to a combination of translational and angular misalignment, primarily in the more-sensitive fast axis of the planar waveguide 200. Overall, misalignment of the master oscillator's signal beam as the signal beam enters a power amplifier reduces the overall power of the output beam 114, at least as measured within the fundamental mode of the planar waveguide 200. Unfortunately, misalignment within the master oscillator/power amplifier beamline can change over time. Even if components are perfectly aligned during manufacturing or installation, misalignment can occur later, such as due to relative slip motion or deformation of optical mounts and structures under operational temperatures or shock and vibration conditions in the field.

Conventional approaches typically use high-power adaptive optics in the output beam path (following the power amplifier) to correct for pointing and wavefront errors in high-power output beams. However, these approaches cannot correct for misalignment of optical components in the master oscillator/power amplifier beamline, particularly in the more-sensitive fast axis of the planar waveguide.

In accordance with this disclosure, the AO system 108 provides for dual-axis modification of the signal beam from the master oscillator 102. The dual-axis modification is based on feedback provided by the optical sensor(s) 116 to the AO controller 118. The modification of the signal beam by the AO system 108 helps to correct for thermally-induced aberrations created within the planar waveguide 200 of the PWG amplifier 104. For example, the phase profile of the signal beam from the master oscillator 102 could be pre-distorted by the AO system 108 so that, once phase distortions created by the PWG amplifier 104 occur, the high-power output beam 114 is (ideally) substantially free from thermally-induced distortions. The modification of the signal beam by the AO system 108 also helps to correct for misalignment in the master oscillator/power amplifier beamline.

In FIG. 1, the AO system 108 includes one or more AO elements 120-122 (two AO elements in this example). Each AO element 120-122 denotes a structure configured to modify an optical signal. For example, each AO element 120-122 could denote a low-power deformable mirror, a liquid crystal-based optical phased array (OPA) or other spatial light modulator, or a steering mirror. Since the AO elements 120-122 are positioned between the master oscillator 102 and the PWG amplifier 104, the AO elements 120-122 are low-power optical devices that operate on the master oscillator's signal beam, as opposed to high-power optical devices that would be needed if the AO elements were positioned after the PWG amplifier 104.

The one or more AO elements 120-122 are configured to provide modifications of the signal beam from the master oscillator 102 in both the fast-axis and slow-axis directions of the planar waveguide 200. One or more AO elements 120-122 can modify the signal beam from the master oscillator 102 in the slow-axis direction, for example, to help compensate for thermally-induced aberrations created in the planar waveguide 200 of the PWG amplifier 104. One or more AO elements 120-122 can also or alternatively modify the signal beam from the master oscillator 102 in the fast-axis direction, for example, to help compensate for misalignment in the master oscillator/power amplifier beamline.

Depending on the implementation, the same AO element(s) could be used for both fast-axis and slow-axis modifications of the signal beam from the master oscillator 102, or different AO elements could be used for fast-axis and slow-axis modifications of the signal beam from the master oscillator 102. For example, each AO element 120-122 could provide single-axis control, where the axes of the AO elements 120-122 are orthogonal. One AO element could be used for beam modification exclusively in the slow-axis direction, and another AO element could be used for beam modification exclusively in the fast-axis direction. As a particular example, the first AO element 120 could control the signal beam exclusively in the fast-axis direction and steer the signal beam with no high-order correction. The second AO element 122 could control the signal beam exclusively in the slow-axis direction and provide all spatial orders of adaptive optics correction (up to a practical limit, such as one set by actuator spacing and resolution of output sensors).

Also, one or multiple AO elements 120-122 could be used for fast-axis modifications of the signal beam from the master oscillator 102, and one or multiple AO elements 120-122 could be used for slow-axis modifications of the signal beam from the master oscillator 102. For example, multiple fast-axis phase control elements or other AO elements 120-122 could be used to control translational and angular misalignment of the signal beam from the master oscillator 102.

The AO controller 118 controls the operation of the one or more AO elements 120-122 based on measurements from the optical sensor(s) 116. In some embodiments as described below, the AO controller 118 operates to (i) determine a shape of the phase front of the output beam 114 based on wavefront and/or far-field sensor measurements, and to (ii) derive control commands that are input to one or more AO elements 120-122 to cause slow-axis correction of the signal beam from the master oscillator 102. This helps to pre-distort the phase front of the master oscillator's signal beam 208 and to correct wavefront errors in the output beam 114. The AO controller 118 also operates to (iii) derive control commands that are input to one or more AO elements 120-122 to cause fast-axis correction of the signal beam from the master oscillator 102 based on output power measurements. This helps to align the master oscillator's signal beam 208 as the signal beam enters the core region of the PWG amplifier 104. In particular embodiments, the AO controller 118 uses a hill-climbing algorithm or other algorithm to control the fast-axis AO element(s) in order to maximize the power of the output beam 114 and maintain the output beam 114 at its peak power.

Because the fast-axis and slow-axis directions of the planar waveguide 200 are orthogonal, it is expected that controls for modifying the master oscillator's signal beam in one axis would be substantially independent of controls for modifying the master oscillator's signal beam in another axis. Stated another way, it is possible that changes to the signal beam in the fast-axis direction would not affect the slow-axis characteristics of the signal beam, and vice versa. However, this need not be the case, and in those embodiments the AO controller 118 could take steps to reduce or avoid competition between the fast-axis and slow-axis AO control loops. For example, in some embodiments, the AO controller 118 could operate the AO control loops so the control loops occur at different frequencies or intervals, such as by ensuring that fast-axis control for misalignment occurs much slower (less frequently) than slow-axis control for beam quality. This can help to prevent the slower misalignment-correcting loop from corrupting the wavefront correction of the faster beam quality-correcting loop(s). In other embodiments, the AO control loops may function at similar bandwidths (frequencies), and slow-axis distortions that occur as a result of fast-axis corrections may be considered and compensated algorithmically by modifying the AO control signals used for slow-axis corrections.

Although FIG. 1 illustrates one example of a high-power laser system 100 supporting a dual-axis AO system 108, various changes may be made to FIG. 1. For example, any number of each component could be used in the laser system 100. As a particular example, a series of PWG amplifiers 104 could be used, rather than a single PWG amplifier 104. While FIG. 2 illustrates one example of a planar waveguide 200 for use in a high-power laser system, various changes may be made to FIG. 2. For instance, the core region 202 need not be planar and could have a tapered shape, and/or the cladding layers 204a-204b need not be symmetrical.

FIGS. 3A and 3B illustrate example sensor arrangements for use in a dual-axis AO system according to this disclosure. In particular, FIGS. 3A and 3B illustrate example ways in which the optical sensor(s) 116 in the AO system 108 of FIG. 1 could be implemented. However, as noted above, various individual sensors or combinations of sensors could be used as the optical sensor(s) 116, and FIGS. 3A and 3B are merely non-limiting examples of such implementations. Other implementations of the optical sensor(s) 116 could also be used.

As shown in FIG. 3A, samples of the high-power output beam are received from the beam splitter 112, and a beam splitter 302 provides portions of the samples to one or more sensors 304-306. The sensors 304-306 generate measurements of the samples and output the measurements to the AO controller 118. For example, the sensor 304 could denote a slow-axis wavefront (WF) sensor and/or a far-field beam quality (BQ) sensor, which can be disposed at an output of the PWG amplifier 104 and provide inputs to the AO controller 118. The AO controller 118 processes the wavefront and/or far-field data and commands one or more AO elements 120-122 to modify the signal beam from the master oscillator 102 in the slow-axis direction. This can help, for example, to compensate for thermally-induced aberrations in the planar waveguide 200 of the PWG amplifier 104. In general, the sensor 304 could measure any suitable characteristic(s) indicative of phase distortions in the output beam 114.

The sensor 306 could denote an optical power sensor, which can also be disposed at an output of the PWG amplifier 104 and provide separate inputs to the AO controller 118. The AO controller 118 processes the optical power data and commands one or more AO elements 120-122 to modify the signal beam from the master oscillator 102 in the fast-axis direction. This can help, for example, to compensate for misalignment in the master oscillator/power amplifier beamline. The optical power sensor could measure total optical power or optical power in the fundamental mode of the planar waveguide 200. In general, the sensor 306 could measure any suitable characteristic(s) indicative of output power in the output beam 114.

As can be seen here, the sensors 304-306 provide different measurements to the different AO control loops. This allows the fast-axis and slow-axis control loops to be based on different metrics of the high-power output beam 114. In this configuration, since the control signals are orthogonal, this allows different AO devices to be operated at similar bandwidths.

FIG. 3B shows one specific implementation of the sensor 304. As described above, the beam splitter 302 provides part of the samples of the high-power output beam 114 to the sensor 304. In this example, the sensor 304 is implemented using a wavefront sensor (WFS) 308 and/or a power-in-the-bucket (PIB) sensor or linear array sensor 310. When both are used, an additional beam splitter 312 can be used to divide the samples of the high-power output beam 114 into multiple sample signals for the sensors 308-310. Relay optics 314 can be used to focus or reformat one of the sample signals onto the sensor 308. Relay optics 316 can be used to focus or reformat another of the sample signals onto a slit structure 318 (when a PIB sensor is used) or directly onto the sensor 310 (when a linear array is used).

The wavefront sensor 308 is configured to sense phase distortions in the samples of the high-power output beam 114 across the slow axis of the PWG amplifier 104. The wavefront sensor 308 outputs wavefront data to the AO controller 118, which uses the wavefront data in determining how to pre-distort the signal beam from the master oscillator 102. The wavefront sensor 308 includes any suitable structure(s) for measuring phase distortions. As a particular example, the wavefront sensor 308 could include a one-dimensional (1D) Shack-Hartman sensor with a linear cylindrical lens array and a 1D semiconductor photodetector array. A Shack-Hartman sensor typically measures the tilt of a distorted phase front at several positions across a beam profile using a lens array to break the beam aperture into multiple sub-apertures, and photodetectors are located at the focus points of the sub-apertures to measure the displacement of the focal spots and hence derive the sub-aperture tilts. Other techniques and devices may be used for phase front sensing, such as interferometers and phase diversity receivers. The optics 314 can be used here to reimage the exit aperture of the PWG amplifier 104 onto the wavefront sensor 308. The optics 314 include any suitable optical device(s) for focusing or reformatting optical signals.

The sensor 310 when implemented as a PIB sensor obtains a portion of the samples of the output beam 114 via the slit structure 318, helping to ensure that only a fraction of the portion of the beam profile that is of high beam quality is received. This portion is measured by the PIB sensor 310 to measure the "power in the bucket" (PIB), which denotes a far-field beam quality measurement of the high-power output beam 114. The PIB sensor 310 includes any suitable structure(s) for capturing far-field beam quality measurements, such as a single photodetector or a group of photodetectors. The optics 316 can be used here to focus the samples of the high-power output beam 114 onto the slit structure 318. The optics 316 include any suitable optical device(s) for focusing or reformatting optical signals. The slit structure 318 includes any suitable structure defining a slit through which light can pass.

The sensor 310 when implemented as a linear array denotes an array of imaging sensors that can measure the far-field beam profile at the output of the PWG amplifier 104. The linear array can therefore be used to measure the PWG amplifier's exit beam profile in the slow axis of the PWG amplifier 104. The linear array denotes any suitable structure(s) for imaging an optical beam or portion thereof.

Various algorithms can be used by the AO controller 118 to process the wavefront, PIB, or linear array measurements and generate control signals for slow-axis modification of the master oscillator's signal beam. For example, in some embodiments, the AO controller 118 uses wavefront sensor data to provide a fast, high bandwidth, low spatial order correction. In particular embodiments, this could be done by decomposing the wavefront data into 1D orthogonal polynomials, such as Legendre or Chebyschev polynomials, and applying a matrix multiplication process to the low-order terms to directly derive actuator commands for a 1D deformable mirror or other adaptive optic. The AO controller 118 could also use PIB or array measurements to provide a slow, low bandwidth, more accurate high spatial order correction. In particular embodiments, this could be done by successively applying different weights to the polynomial terms (possibly in a trial and error fashion) to improve far-field beam quality as the temporal evolution of the phase distortions trends to steady-state.

In some embodiments, the AO controller 118 could use the pre-distortion approaches described in U.S. Pat. No. 8,787,768 (which is hereby incorporated by reference). These techniques can be applied to spatial waveforms in order to enhance the performance of the algorithms described above that are based on 1D polynomial decompositions. These techniques also include mechanisms to "kick start" a pre-distortion process for a brief transient period after the master oscillator 102 first turns on and the PWG amplifier 104 is ramped to high gain. Additionally, an algorithm or look-up table may be used to accommodate a change in a waveform that occurs, such as due to deterministic thermal changes in the PWG lasing medium between the end of one engagement of the laser system 100 and the start of the subsequent engagement. In particular embodiments, the results of an algorithmic calculation or look-up table may include a set of coefficients and/or scaling parameters that are applied to the orthogonal polynomials described above.

The AO controller 118 could also support the use of one or more back-propagation algorithms to adjust the pre-distortion signal for improved wavefront correction at the output of the PWG amplifier 104. To support this functionality, the AO controller 118 could include at least one wave optics propagation model, which mathematically represents how light may become distorted within the PWG amplifier 104 and other components of the laser system 100. The AO controller 118 can use measurements from the wavefront sensor 308 to identify the shape of the distorted wavefront of the output beam 114. The AO controller 118 can then use the model(s) to "back propagate" the distorted wavefront measured on the output side of the PWG amplifier 104 to the optical plane where one or more of the AO elements 120-122 are located. The AO controller 118 uses this information in determining how one or more of the AO elements 120-122 should pre-distort the master oscillator's signal beam.

Any suitable model could be generated based on the PWG amplifier 104 and other components used in the laser system 100. For example, in some embodiments, phase distortions created by the PWG amplifier 104 are assumed to be evenly distributed along the length of the PWG amplifier 104. The back propagation process starts at the aperture of the wavefront sensor 308. Angular, wavelet, or other digital propagation routines can be used to calculate the change in amplitude and phase front from one location to the next in the system 100. Care can be taken to use a sufficiently large array size to represent the propagating phase fronts to avoid aliasing near the edges of the beams. In other embodiments, phase distortions may be modeled unevenly along the optical path through the PWG amplifier 104. For instance, the calculation of the changes in amplitude and phase front could occur for locations grouped more closely where thermal distortions are greatest, such as near the ends of the PWG amplifier 104 and/or in regions where the thermal gradients are highest in the PWG amplifier 104. The areas of greatest thermal distortion could be identified in any suitable manner, such as through finite element thermal analysis of the PWG amplifier 104 under specified optical pumping and laser power extraction conditions, using thermography of the PWG amplifier 104 during actual operation, or using some other thermal analysis technique.

Although FIGS. 3A and 3B illustrate examples of sensor arrangements for use in a dual-axis AO system 108, various changes may be made to FIGS. 3A and 3B. For example, as noted above, a single sensor (such as a two-dimensional camera) could be used to capture sensor measurements along multiple axes. Also, both the wavefront sensor 308 and the PIB/linear array sensor 310 (and their associated components) are used in the feedback loop in FIG. 3B. However, it is possible to use only wavefront measurements or only PIB/linear array measurements, in which case the components for other measurements could be omitted and the beam splitter 312 could be omitted or replaced with other optical device(s), such as a mirror.

Figure 4:
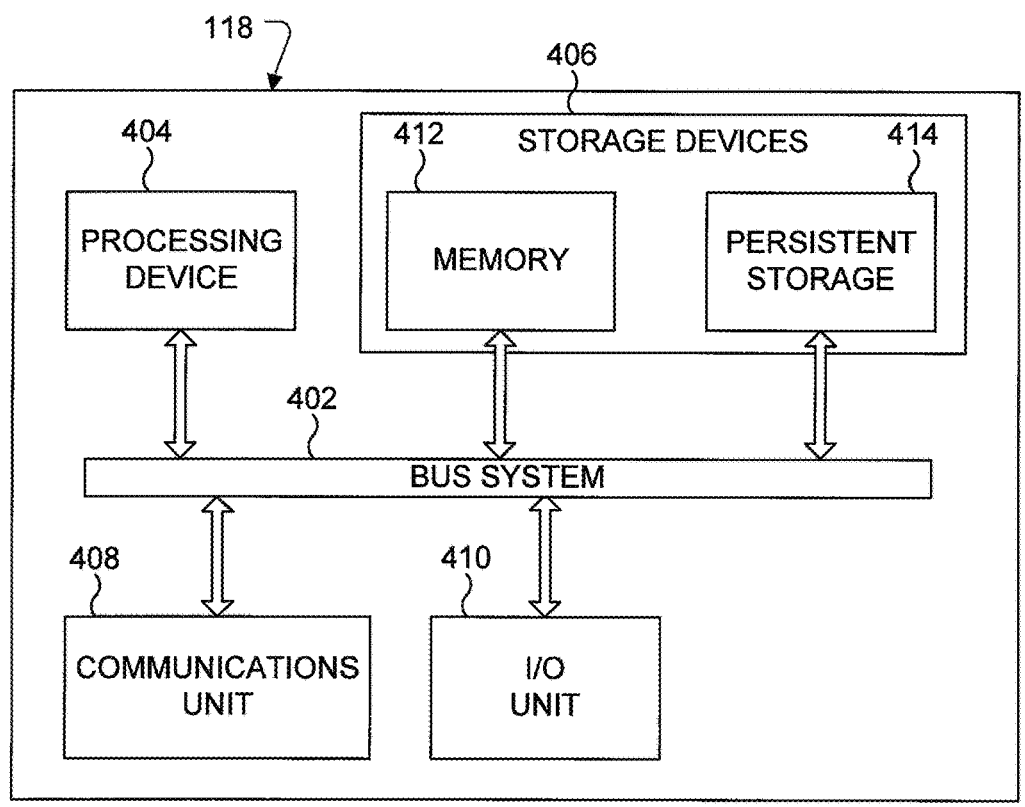
FIG. 4 illustrates an example AO controller for use in a dual-axis AO system according to this disclosure.

FIG. 4 illustrates an example AO controller 118 for use in a dual-axis AO system according to this disclosure. As shown in FIG. 4, the AO controller 118 includes a bus system 402, which supports communication between at least one processing device 404, at least one storage device 406, at least one communications unit 408, and at least one input/output (I/O) unit 410.

The processing device 404 executes instructions that may be loaded into a memory 412. The instructions could support any suitable functions of the AO controller 118, such as slow-axis and fast-axis adaptive optic control calculations. The processing device 404 may include any suitable number(s) and type(s) of processors or other computing devices in any suitable arrangement. Example types of processing devices 404 include microprocessors, microcontrollers, digital signal processors, field programmable gate arrays, application specific integrated circuits, and discrete circuitry.

The memory 412 and a persistent storage 414 are examples of storage devices 406, which represent any structure(s) capable of storing and facilitating retrieval of information (such as data, program code, and/or other suitable information on a temporary or permanent basis). The memory 412 may represent a random access memory or any other suitable volatile or non-volatile storage device(s). The persistent storage 414 may contain one or more components or devices supporting longer-term storage of data, such as a read only memory, hard drive, Flash memory, or optical disc.

The communications unit 408 supports communications with other systems or devices. For example, the communications unit 408 could include a network interface card or a wireless transceiver facilitating communications with the sensors 304-306 and the AO elements 120-122. The communications unit 408 may support communications through any suitable physical or wireless communication link(s).

The I/O unit 410 allows for input and output of data. For example, the I/O unit 410 may provide a connection for user input through a keyboard, mouse, keypad, touchscreen, or other suitable input device. The I/O unit 410 may also send output to a display, printer, or other suitable output device.

Although FIG. 4 illustrates one example of an AO controller 118 for use in a dual-axis AO system 108, various changes may be made to FIG. 4. For example, various components in FIG. 4 could be combined, further subdivided, or omitted and additional components could be added according to particular needs. Also, computing devices can come in a wide variety of configurations, and FIG. 4 does not limit this disclosure to any particular laser controller.

Figure 5:
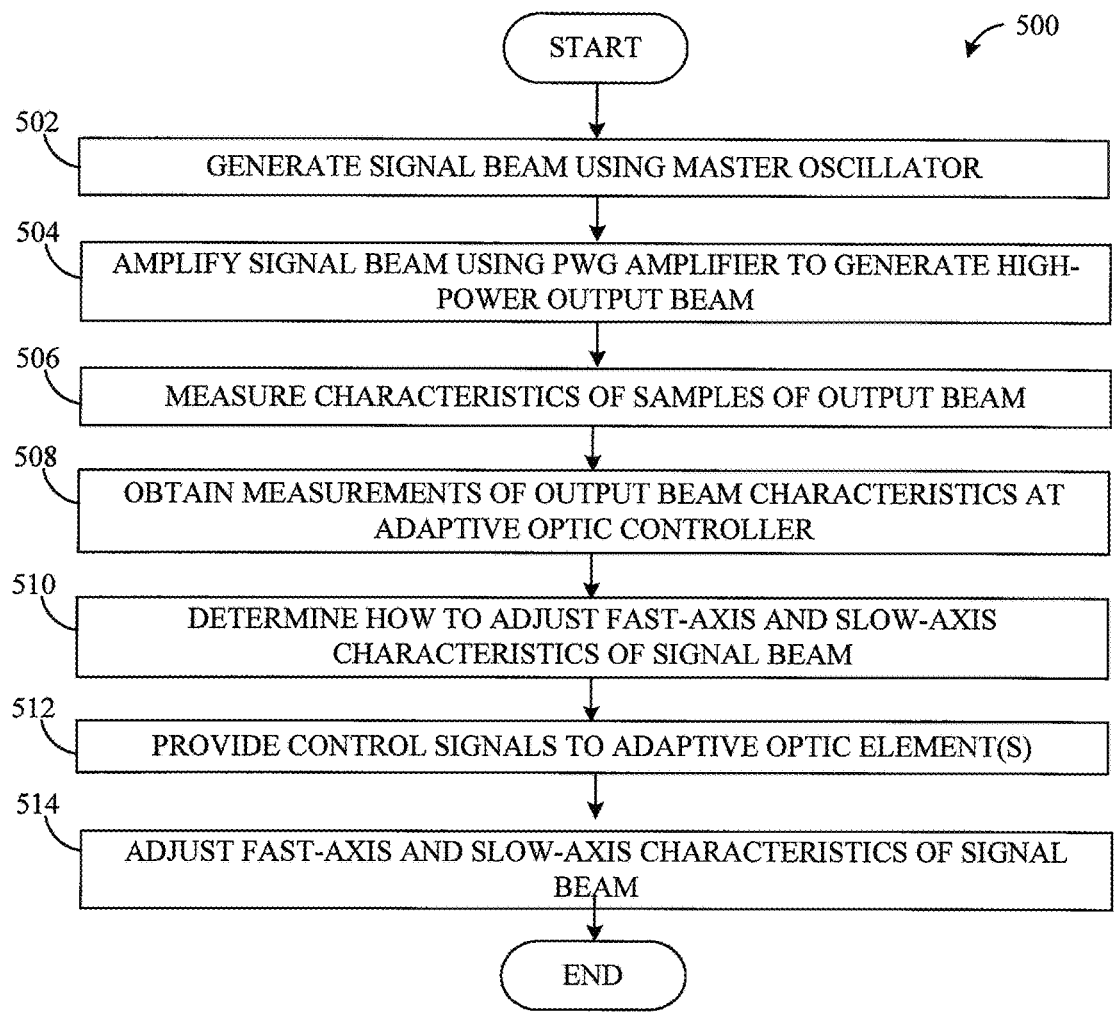
FIG. 5 illustrates an example method for dual-axis AO correction in a high-power laser system according to this disclosure.

FIG. 5 illustrates an example method 500 for dual-axis AO correction in a high-power laser system according to this disclosure. For ease of explanation, the method 500 is described with respect to the AO system 108 operating in the laser system 100 of FIG. 1. However, the method 500 could be used by any suitable device(s) and in any suitable system(s).

As shown in FIG. 5, a signal beam is generated using a master oscillator at step 502, and the signal beam is amplified using a PWG amplifier to create a high-power output beam at step 504. This could include, for example, the master oscillator 102 generating a lower-power signal beam having the desired waveform. This could also include the PWG amplifier 104 amplifying the lower-power signal beam using pump power (such as from one or more arrays of laser diodes) to generate the high-power output beam 114.

Characteristics of samples of the high-power output beam are measured at step 506 and obtained by an AO controller at step 508. This could include, for example, the optical sensor(s) 116 capturing wavefront, power-in-the-bucket, linear array, or output power measurements of samples of the high-power output beam 114. This could also include the optical sensor(s) 116 providing the measurements to the AO controller 118.

The AO controller determines how to adjust one or more fast-axis characteristics and one or more slow-axis characteristics of the master oscillator's signal beam at step 510. This could include, for example, the AO controller 118 using wavefront, power-in-the-bucket, or linear array measurements from the optical sensor(s) 116 to determine how to adjust one or more slow-axis characteristics of the master oscillator's signal beam. As a particular example, the AO controller 118 could use the wavefront, power-in-the-bucket, or linear array measurements to determine how one or more AO elements can pre-distort the phase profile of the master oscillator's signal beam. This could also include the AO controller 118 using the output power measurements to determine how to adjust one or more fast-axis characteristics of the master oscillator's signal beam. As a particular example, the AO controller 118 could use the output power measurements to determine how one or more AO elements can align the master oscillator's signal beam with the PWG amplifier core in order to increase or maximize the power contained in the output beam 114.

One or more control signals are generated and provided to one or more AO elements at step 512, and the one or more AO elements adjust the fast-axis and slow-axis characteristic(s) of the master oscillator's signal beam based on the control signals at step 514. This could include, for example, at least one of the AO elements (such as element 120) providing fast-axis correction to reduce or eliminate misalignment in the master oscillator/power amplifier beamline. This could also include at least one of the AO elements (such as element 122) providing slow-axis correction to reduce or eliminate phase distortions in the output beam 114. As noted above, a single AO element could be used to provide both forms of correction, or multiple AO elements could be used to provide each form of correction.

Note that, as described above, the fast-axis and slow-axis calculations made by the AO controller 118 could occur in various ways. For example, the fast-axis calculations for misalignment could occur much slower or less frequently than the slow-axis calculations for beam quality. As another example, the fast-axis and slow-axis control loops could operate at similar bandwidths, and the slow-axis correction signal can be corrected algorithmically to account for wavefront changes that occur from the misalignment corrections.

Although FIG. 5 illustrates one example of a method 500 for dual-axis AO correction in a high-power laser system, various changes may be made to FIG. 5. For example, while shown as a series of steps, various steps in FIG. 5 could overlap, occur in parallel, occur in a different order, or occur any number of times. As a particular example, steps 506-514 could occur repeatedly or continuously while steps 502-504 are being performed.

Note that in the above discussion, the AO elements 120-122 of the AO system 108 are routinely described as providing thermal and angular corrections in the low-power optical path. However, the AO elements 120-122 of the AO system 108 can be used to correct for other sources of distortion, as well. For example, one or more of the AO elements 120-122 providing slow-axis correction could correct for a combination of optical and thermal aberrations in the slow-axis beam line.

High-power laser systems, such as the ones described above, could be used in a large number of military and commercial applications. The following discussion provides a description of various example commercial applications. However, the following discussion does not limit this disclosure to any particular applications.

High-power laser systems could find use in commercial mining applications, such as in drilling, mining, or coring operations. For instance, high-power laser systems could be used to soften or weaken an earth bed prior to drilling through the earth bed using drill bits. This could allow for fewer drill bit changes and extended lifetimes and reliabilities of the drill bits. Here, free-space propagation of a high-power laser beam from an output window of a laser system could be used, allowing deeper penetration at further distances compared to conventional fiber lasers.

High-power and high-beam quality laser systems could also find use in remote laser welding, cutting, drilling, or heat treating operations, such as in industrial or other automation settings. The use of a high-power and high-beam quality laser system allows the processing of thicker materials to occur at larger working distances from the laser system while minimizing the heat-affected zone and maintaining vertical or other cut lines. Among other things, this helps to support welding or cutting operations where proximity to the weld or cut site is difficult or hazardous. It also helps to protect the laser system and possibly any human operators from smoke, debris, or other harmful materials.

High-power laser systems could further find use in construction and demolition operations. Example operations could include metal resurfacing or deslagging, paint removal, and industrial demolition operations. High-power laser systems can be used to ablate material much faster and safer compared to conventional operations. As a particular example of this functionality, high-power laser systems could be used to support demolition of nuclear reactors or other hazardous structures. Here, the high-power laser systems could be used to cut through contaminated structures like contaminated concrete or nuclear containment vessels or reactors from long distances. This helps to avoid the use of water jet cuffing or other techniques that create hazardous waste, such as contaminated water. It also provides improved safety since human operators can remain farther away from contaminated structures being demolished.

A number of additional applications are possible. For example, high-power laser systems could find use in power beaming applications, where high-power laser beams are targeted to photovoltaic (solar) cells of remote devices to be recharged. High-power laser systems could find use in hazardous material (HAZMAT) applications, where the laser systems are used to heat and decompose hazardous materials into less harmful or non-harmful materials.

It may be advantageous to set forth definitions of certain words and phrases used throughout this patent document. The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this patent document should not be read as implying that any particular element, step, or function is an essential or critical element that must be included in the claim scope. Also, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," "processing device," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
    a master oscillator configured to generate a first optical beam;
    a planar waveguide (PWG) amplifier configured to generate a second optical beam using the first optical beam, the second optical beam having a higher power than the first optical beam, the PWG amplifier having a larger dimension in a slow-axis direction and a smaller dimension in a fast-axis direction;
    at least one adaptive optic (AO) element configured to modify the first optical beam along the slow-axis direction and to modify the first optical beam along the fast-axis direction; and
    a feedback loop configured to control the at least one AO element;
    wherein the at least one AO element is configured to modify the first optical beam along the slow-axis direction in order to compensate for thermal-based distortions created by the PWG amplifier; and
    wherein the at least one AO element is configured to modify the first optical beam along the fast-axis direction in order to compensate for optical misalignment associated with the master oscillator and the PWG amplifier.

2. The system of claim 1, wherein the feedback loop comprises:
    one or more sensors configured to generate measurements of multiple characteristics of samples of the second optical beam; and
    a controller configured to control the at least one AO element based on the measurements.

3. The system of claim 1, wherein each AO element comprises one of: a deformable mirror, a liquid crystal-based optical phased array, a spatial light modulator, and a steering mirror.

4. A system comprising:
    a master oscillator configured to generate a first optical beam;
    a planar waveguide (PWG) amplifier configured to generate a second optical beam using the first optical beam, the second optical beam having a higher power than the first optical beam, the PWG amplifier having a larger dimension in a slow-axis direction and a smaller dimension in a fast-axis direction;
    at least one adaptive optic (AO) element configured to modify the first optical beam along the slow-axis direction and to modify the first optical beam along the fast-axis direction; and
    a feedback loop configured to control the at least one AO element;
    wherein the feedback loop comprises a first control loop configured to control the modification of the first optical beam along the slow-axis direction and a second control loop configured to control the modification of the first optical beam along the fast-axis direction; and
    wherein the first and second control loops are configured to use measurements of different characteristics of samples of the second optical beam.

5. The system of claim 4, wherein the first and second control loops are configured to operate at different frequencies or intervals.

6. The system of claim 4, wherein:
    the first and second control loops are configured to operate at similar frequencies; and
    the first control loop is configured to consider changes to the first optical beam caused by the second control loop.

7. A system comprising:
    a master oscillator configured to generate a first optical beam;
    a planar waveguide (PWG) amplifier configured to generate a second optical beam using the first optical beam, the second optical beam having a higher power than the first optical beam, the PWG amplifier having a larger dimension in a slow-axis direction and a smaller dimension in a fast-axis direction;
multiple adaptive optic (AO) elements configured to modify the first optical beam along the slow-axis direction and to modify the first optical beam along the fast-axis direction; and
a feedback loop configured to control the multiple AO elements;
wherein the multiple AO elements are configured to correct both translational and angular misalignment associated with the master oscillator and the PWG amplifier.

8. A method comprising:
generating a first optical beam using a master oscillator;
amplifying the first optical beam to generate a second optical beam using a planar waveguide (PWG) amplifier, the second optical beam having a higher power than the first optical beam, the PWG amplifier having a larger dimension in a slow-axis direction and a smaller dimension in a fast-axis direction;
using at least one adaptive optic (AO) element, modifying the first optical beam along the slow-axis direction and along the fast-axis direction; and
controlling the at least one AO element using a feedback loop;
wherein modifying the first optical beam comprises:
modifying the first optical beam along the slow-axis direction in order to compensate for thermal-based distortions created by the PWG amplifier; and
modifying the first optical beam along the fast-axis direction in order to compensate for optical misalignment associated with the master oscillator and the PWG amplifier.

9. The method of claim 8, wherein controlling the at least one AO element using the feedback loop comprises:
obtaining measurements of multiple characteristics of samples of the second optical beam from one or more sensors; and
controlling the at least one AO element based on the measurements.

10. The method of claim 9, wherein:
the one or more sensors comprise a two-dimensional camera;
one dimension of the camera corresponds to the slow-axis direction; and
an orthogonal dimension of the camera corresponds to the fast-axis direction.

11. A method comprising:
generating a first optical beam using a master oscillator;
amplifying the first optical beam to generate a second optical beam using a planar waveguide (PWG) amplifier, the second optical beam having a higher power than the first optical beam, the PWG amplifier having a larger dimension in a slow-axis direction and a smaller dimension in a fast-axis direction;
using at least one adaptive optic (AO) element, modifying the first optical beam along the slow-axis direction and along the fast-axis direction; and
controlling the at least one AO element using a feedback loop;
wherein the feedback loop comprises a first control loop that controls the modification of the first optical beam along the slow-axis direction and a second control loop that controls the modification of the first optical beam along the fast-axis direction; and
wherein the first and second control loops use measurements of different characteristics of samples of the second optical beam.

12. The method of claim 11, wherein the first and second control loops operate at different frequencies or intervals.

13. The method of claim 11, wherein:
the first and second control loops operate at similar frequencies; and
the first control loop considers changes to the first optical beam caused by the second control loop.

14. The method of claim 11, wherein:
the first control loop controls the modification of the first optical beam along the slow-axis direction based on at least one of: wavefront sensor measurements, power-in-the-bucket sensor measurements, and linear array sensor measurements; and
the second control loop controls the modification of the first optical beam along the fast-axis direction based on output power sensor measurements.

15. A method comprising:
generating a first optical beam using a master oscillator;
amplifying the first optical beam to generate a second optical beam using a planar waveguide (PWG) amplifier, the second optical beam having a higher power than the first optical beam, the PWG amplifier having a larger dimension in a slow-axis direction and a smaller dimension in a fast-axis direction;
using multiple adaptive optic (AO) elements, modifying the first optical beam along the slow-axis direction and along the fast-axis direction; and
controlling the multiple AO elements using a feedback loop;
wherein the multiple AO elements correct both translational and angular misalignment associated with the master oscillator and the PWG amplifier.

16. An apparatus comprising:
at least one interface configured to receive measurements of samples of a second optical beam generated by a planar waveguide (PWG) amplifier using a first optical beam generated by a master oscillator such that the second optical beam has a higher power than the first optical beam, the PWG amplifier having a larger dimension in a slow-axis direction and a smaller dimension in a fast-axis direction; and
at least one processing device configured to:
control one or more first adaptive optic (AO) elements to modify the first optical beam along the slow-axis direction; and
control one or more second AO elements to modify the first optical beam along the fast-axis direction.

17. An apparatus comprising:
at least one interface configured to receive measurements of samples of a second optical beam generated by a planar waveguide (PWG) amplifier using a first optical beam generated by a master oscillator such that the second optical beam has a higher power than the first optical beam, the PWG amplifier having a larger dimension in a slow-axis direction and a smaller dimension in a fast-axis direction; and
at least one processing device configured to control at least one adaptive optic (AO) element to:
modify the first optical beam along the slow-axis direction in order to compensate for thermal-based distortions created by the PWG amplifier; and modify the first optical beam along the fast-axis direction in order to compensate for optical misalignment associated with the master oscillator and the PWG amplifier.

18. An apparatus comprising:
at least one interface configured to receive measurements of samples of a second optical beam generated by a planar waveguide (PWG) amplifier using a first optical beam generated by a master oscillator such that the second optical beam has a higher power than the first optical beam, the PWG amplifier having a larger dimension in a slow-axis direction and a smaller dimension in a fast-axis direction; and
at least one processing device configured to control at least one adaptive optic (AO) element to modify the first optical beam along the slow-axis direction and along the fast-axis direction;
wherein the at least one processing device is configured to form part of a first control loop that controls the modification of the first optical beam along the slow-axis direction and part of a second control loop that controls the modification of the first optical beam along the fast-axis direction; and
wherein the at least one processing device is configured to use measurements of different characteristics of the samples for the different control loops.

19. The apparatus of claim 18, wherein the first and second control loops are configured to operate at different frequencies or intervals.

20. The apparatus of claim 18, wherein:
the first and second control loops are configured to operate at similar frequencies; and
the first control loop is configured to consider changes to the first optical beam caused by the second control loop.

21. The apparatus of claim 18, wherein the at least one processing device is configured to:
control one or more first AO elements to modify the first optical beam along the slow-axis direction; and
control one or more second AO elements to modify the first optical beam along the fast-axis direction.

22. The system of claim 2, wherein:
the feedback loop comprises (i) a first control loop configured to control the modification of the first optical beam along the slow-axis direction and (ii) a second control loop configured to control the modification of the first optical beam along the fast-axis direction; and
the first and second control loops are configured to use measurements of different characteristics of the samples.

23. The system of claim 1, wherein the feedback loop is configured to:
control one or more first AO elements to modify the first optical beam along the slow-axis direction; and
control one or more second AO elements to modify the first optical beam along the fast-axis direction.

* * * * *